(12) United States Patent
Chen (10) Patent No.: US 7,218,161 B2
(45) Date of Patent: May 15, 2007

(54) SUBSTANTIALLY TEMPERATURE INDEPENDENT DELAY CHAIN

(75) Inventor: Chung Kuang Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 129 days.

(21) Appl. No.: 10/922,798

(22) Filed: Aug. 20, 2004

(65) Prior Publication Data

US 2006/0038600 A1  Feb. 23, 2006

(51) Int. Cl.
*H03H 11/26* (2006.01)
(52) U.S. Cl. .................................. 327/262; 327/378
(58) Field of Classification Search ............... None
See application file for complete search history.

(56) References Cited

U.S. PATENT DOCUMENTS

| | | | |
|---|---|---|---|
| 4,255,721 A | 3/1981 | Wilson, Jr. | |
| 4,482,826 A * | 11/1984 | Ems et al. ................. | 327/270 |
| 4,547,749 A | 10/1985 | Kuo | |
| 4,714,901 A | 12/1987 | Jain et al. | |
| 4,746,823 A | 5/1988 | Lee | |
| 4,843,265 A | 6/1989 | Jiang | |
| 4,940,910 A | 7/1990 | Jiang | |
| 5,061,908 A | 10/1991 | Pietrzyk | |
| 5,663,921 A | 9/1997 | Pascucci et al. | |
| 5,808,478 A * | 9/1998 | Andresen ..................... | 326/31 |
| 5,818,270 A * | 10/1998 | Hamza ........................ | 327/116 |
| 5,835,423 A | 11/1998 | Harima | |
| 6,072,733 A | 6/2000 | Advani | |
| 6,075,832 A | 6/2000 | Geannopoulos | |
| 6,490,224 B2 | 12/2002 | Manning | |
| 6,560,164 B2 | 5/2003 | Kawai et al. | |
| 6,570,428 B1 | 5/2003 | Liao et al. | |
| 6,643,789 B2 | 11/2003 | Mullarkey | |
| 6,710,617 B2 * | 3/2004 | Humphrey ................... | 326/30 |

OTHER PUBLICATIONS

Yeh, C.C. et al., "Novel Operation Schemes to Improve Device Reliability in a Localized Trapping Storage SONOS-Type Flash Memory," IEDM 2003 173-176, no month.

* cited by examiner

*Primary Examiner*—Timothy P. Callahan
*Assistant Examiner*—Cassandra Cox
(74) *Attorney, Agent, or Firm*—Kenta Suzue; Haynes Beffel & Wolfeld LLP (57) ABSTRACT

Methods and apparatuses are discussed for generating a temperature compensated signal, used for example to provide a signal with a delay within a pre-specified range over a range of temperatures to a sense amplifier of a memory array. In response to a start signal, a varying signal is generated. A clock signal causes additional loads of impedance to be coupled to the varying signal, for example via control circuitry generating temperature compensating signals.

47 Claims, 9 Drawing Sheets

SUBSTANTIALLY TEMPERATURE INDEPENDENT DELAY CHAIN

REFERENCE TO RELATED APPLICATION

This application is related to a commonly owned application by the same inventor. It is related to U.S. application Ser. No. 10/872,018, filed on 18 Jun. 2004, entitled "PROCESS INDEPDENDENT DELAY CHAIN." This application is hereby incorporated by reference, as if set forth in full.

BACKGROUND OF THE INVENTION

1. Field of the Invention

The present invention relates to clocked integrated circuits generally, and more particularly to integrated circuits with signals having a pre-specified delay over a range of temperatures.

2. Description of Related Art

A variety of integrated circuits with different mission functions have high clock rates and as a result have precise timing requirements. For example, in some memory devices, the sense amplifier senses the data in one clock cycle, and therefore the timing of the data output in response to the read signal must be precisely controlled. However, producing signals on an integrated circuit with precise delays across a range of temperatures is a nontrivial problem due to the varying behavior of semiconductors that occurs at different temperatures.

One approach to addressing temperature variations is to employ a design methodology with a "worst case" modeling approach. Such an approach consistently underestimates circuit performance, and results in expensive over-design. A needed approach is to make integrated circuits that satisfy demanding timing requirements without unnecessary and expensive over-design.

SUMMARY OF THE INVENTION

One aspect of the invention is a method for generating a temperature compensated signal with an integrated circuit while using the integrated circuit. A varying signal, having a varying characteristic such as voltage or current, is generated on a portion of the integrated circuit in response to a start signal at a first time. A clock signal is generated on the integrated circuit, which is applied to multiple loads on the integrated circuit. In response the clock signal, additional impedance of the multiple loads is coupled to the portion of the circuit with the varying signal. In response to the varying characteristic of the varying signal reaching a reference level, a signal on the integrated circuit is generated at a second time. The signal is characterized by a delay within a pre-specified range between the first time and the second time over a range of temperatures.

In many embodiments, the clock signal acts through control circuitry to create temperature compensating signals, which in turn couple additional impedances of the multiple loads to the portion of the circuit with the varying signal.

Another aspect of the invention is an integrated circuit device. The integrated circuit has a circuit carrying a varying signal having a varying characteristic, clock circuitry, multiple impedances, and an output. The circuit carries the varying signal in response to a start signal at a first time. The clock circuitry, which for example is a ring oscillator, is configured to generate a clock signal. The multiple impedances are coupled to the clock circuitry and the circuit, and have a total impedance that increases in response to the clock signal. The output is coupled to the circuit and passed at a second time a signal characterized by a delay within a pre-specified range between the first time and the second time over a range of temperatures.

Another aspect of the invention is a method of manufacturing an integrated circuit device. A semiconductor substrate is provided. A circuit is formed which carries, in response to a start signal at a first time, a varying signal having a varying characteristic. The clock circuitry is formed on the semiconductor substrate configured to generate a clock signal. Multiple impedances are formed on the semiconductor substrate coupled to the clock circuitry and the circuit, which have a total impedance that increases in response to the clock signal. An output is formed on the semiconductor substrate coupled to the circuit, which passes at a second time a signal characterized by a delay within a pre-specified range between the first time and the second time over a range of temperatures.

In various embodiments, the signal provides timing for a sense amplifier. The sense amplifier is coupled to a memory array, and both are included in some embodiments of the invention.

The temperature dependence of many embodiments is evident in that a varying signal, generated for example by an inverter, coupled to a constant load will tend to vary faster with decreasing temperature. To compensate for this temperature dependence, a clock is used to couple additional impedances to the varying signal. The clock signal is generated more quickly with decreasing temperature, and more slowly with increasing temperature. As temperature decreases, the clock signal is generated more quickly and the additional impedance is coupled to the varying signal more quickly. As temperature increases, the clock signal is generated more slowly and the additional impedance is coupled to the varying signal more slowly. The multiple impedances are carefully selected such that the delay is substantially constant, remaining within a pre-specified range over a temperature range of at least 120 degrees. In some embodiments, the delay varies no more than 1 nanosecond over a temperature range of at least 120 degrees Celsius. In one embodiment, the circuit responds to a start signal by generating a signal after a 10 ns delay, varying by no more than 2 ns over a temperature range of 160 degrees Celsius.

The multiple edges of the clock signal are consecutive or nonconsecutive falling or rising edges, depending on the p-type or n-type nature of the transistors and the circuit configuration. Control circuitry receives as input the multiple edges of the clock signal and outputs control signals that increase the total impedance of the multiple impedances in response to each edge of the multiple edges of the clock signal. In some embodiments, the control signals turn on NMOS pass transistors that electrically couple additional impedances to the varying signal. In some embodiments, the control signals turn on PMOS pass transistors that electrically couple additional impedances to the varying signal.

The varying characteristic of the varying signal rises to the reference level in an embodiment where the initial level of the varying signal is low, for example at ground. The varying characteristic of the varying signal lowers to the reference level, in an embodiment where the initial level of the varying signal is high, for example at the supply voltage. In some embodiments, the level of the varying signal is detected by a level detector, compared to a reference level, and generates the signal after the varying signal reaches the reference level.

Another aspect is a method of generating a temperature compensated output on an integrated circuit. In response to a start signal at a first time on an integrated circuit, a first circuit of the integrated circuit is triggered to perform a main function of the first circuit and generate a main function output signal, and a second circuit of the integrated circuit is triggered to generate a second signal at a second time. The second signal has a delay within a pre-specified range between the first time and the second time. The delay is independent of a timing of the main function output. The main function output signal is allowed to pass to other circuitry on the integrated circuit after the delay.

Another aspect is an integrated circuit device, with several circuits. A first circuit performs, in response to a start signal at a first time, a main function of the first circuit and generates a main function output signal. A second circuit generates, in response to the start signal, a second signal at a second time. The second signal has a delay within a pre-specified range between the first time and the second time. The delay is independent of a timing of the main function output. A third circuit is coupled to the first circuit and the second circuit, and receives the main function output signal and the second signal. The third circuit allows the main function output signal to pass to other circuitry on the integrated circuit after the delay.

In some embodiments, the delay is made independent of the main function output, by controlling the delay with a clock signal triggered in response to the start signal.

DETAILED DESCRIPTION

Figure 1:
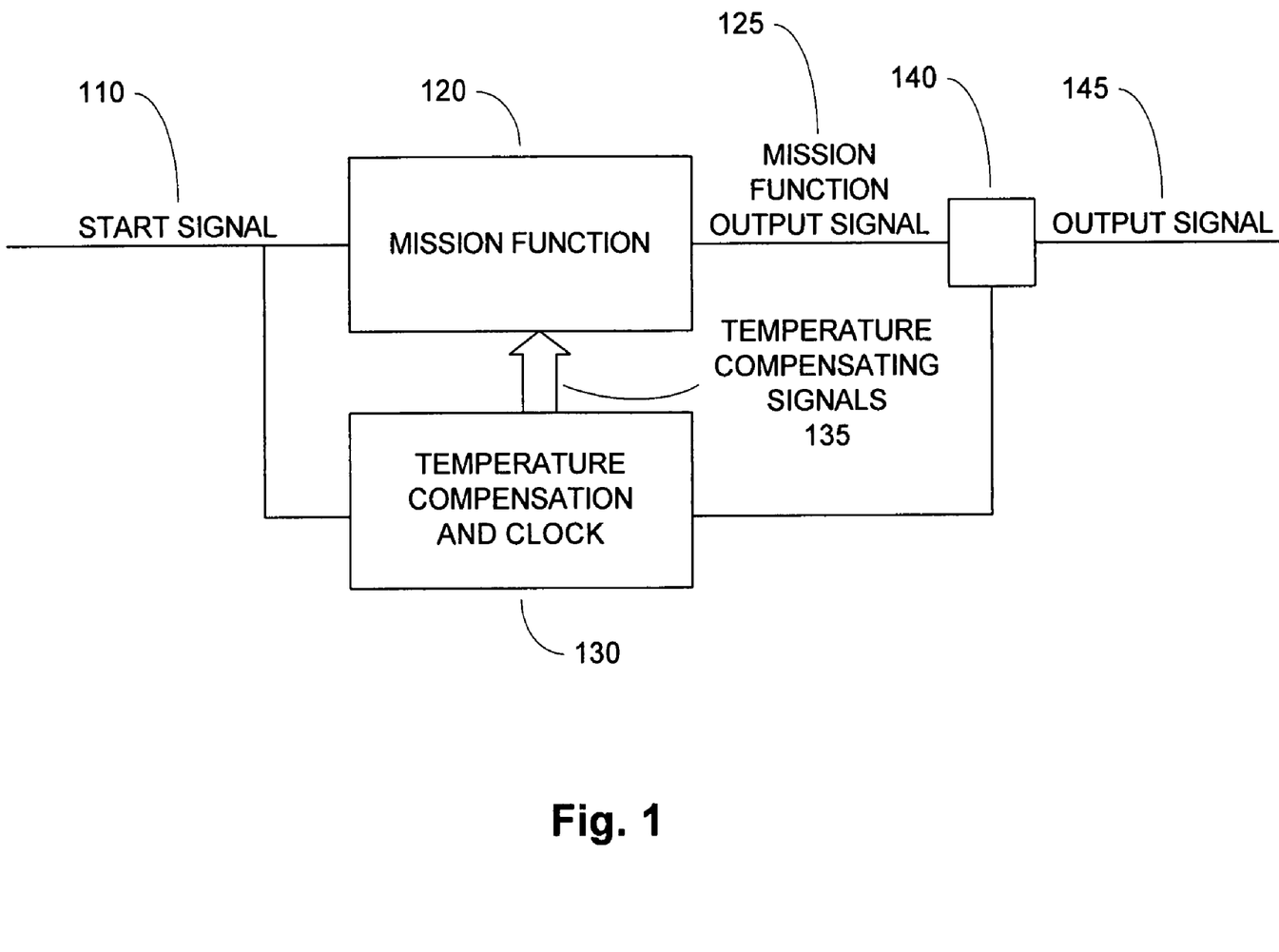
FIG. 1 is a simplified block diagram of a circuit for adjusting the timing of a signal and mission function circuitry.

FIG. 1 is a simplified block diagram of temperature compensation circuitry 130 and mission function circuitry 120. The mission function circuitry 120 includes circuits, which carry out the purpose of the integrated circuit as a whole or of a particular functional block of the integrated circuit. The temperature compensation circuitry 130 and the mission function circuitry 120 both receive start signal 110. After receiving start signal 110, the temperature compensation circuitry 130 generates a temperature compensating signals 135 with a precision of n nanoseconds, no matter the ambient temperature within a wide temperature range, such as 120 degrees. Circuitry 140 treats the timing output signal as an enable signal and generates output signal 145, which is based on mission function output signal 125. Circuitry 140 may also amplify the mission function output signal 125 to generate output signal 145. Thus, many embodiments are useful in any integrated circuit where input and output signals of a temperature compensation circuit must obey a tightly specified delay relationship regardless of the ambient temperature.

Figure 2:
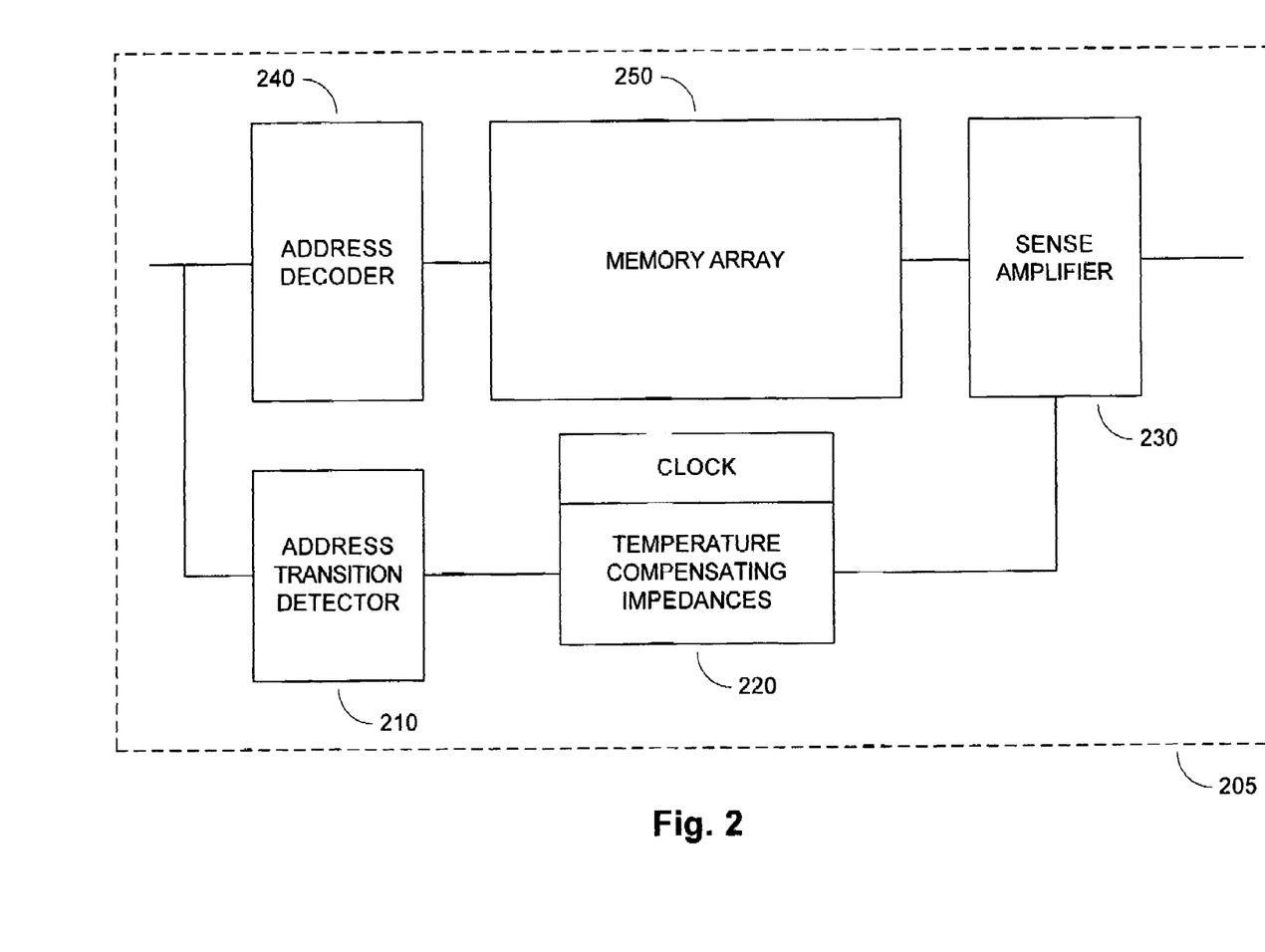
FIG. 2 is a simplified block diagram of an integrated circuit with a memory array and a circuit for adjusting the timing of a signal.

FIG. 2 is a simplified block diagram of a memory integrated circuit 205. Memory array 250 receives signals from address decoder 240 to access a particular cell or block of memory array 250. A sense amplifier 230 reads stored values from the memory array 250. The sense amplifier 230 must be clocked properly from the temperature compensation circuitry 220 so that amplification of the bit line voltages of the memory array 250 occurs with precise timing, regardless of the ambient temperature. The temperature compensation circuitry adds additional impedances at rate depending on the clock speed, thereby maintaining a timing of the sense amplifier within a pre-specified time range across a range of temperatures.

Figure 3:
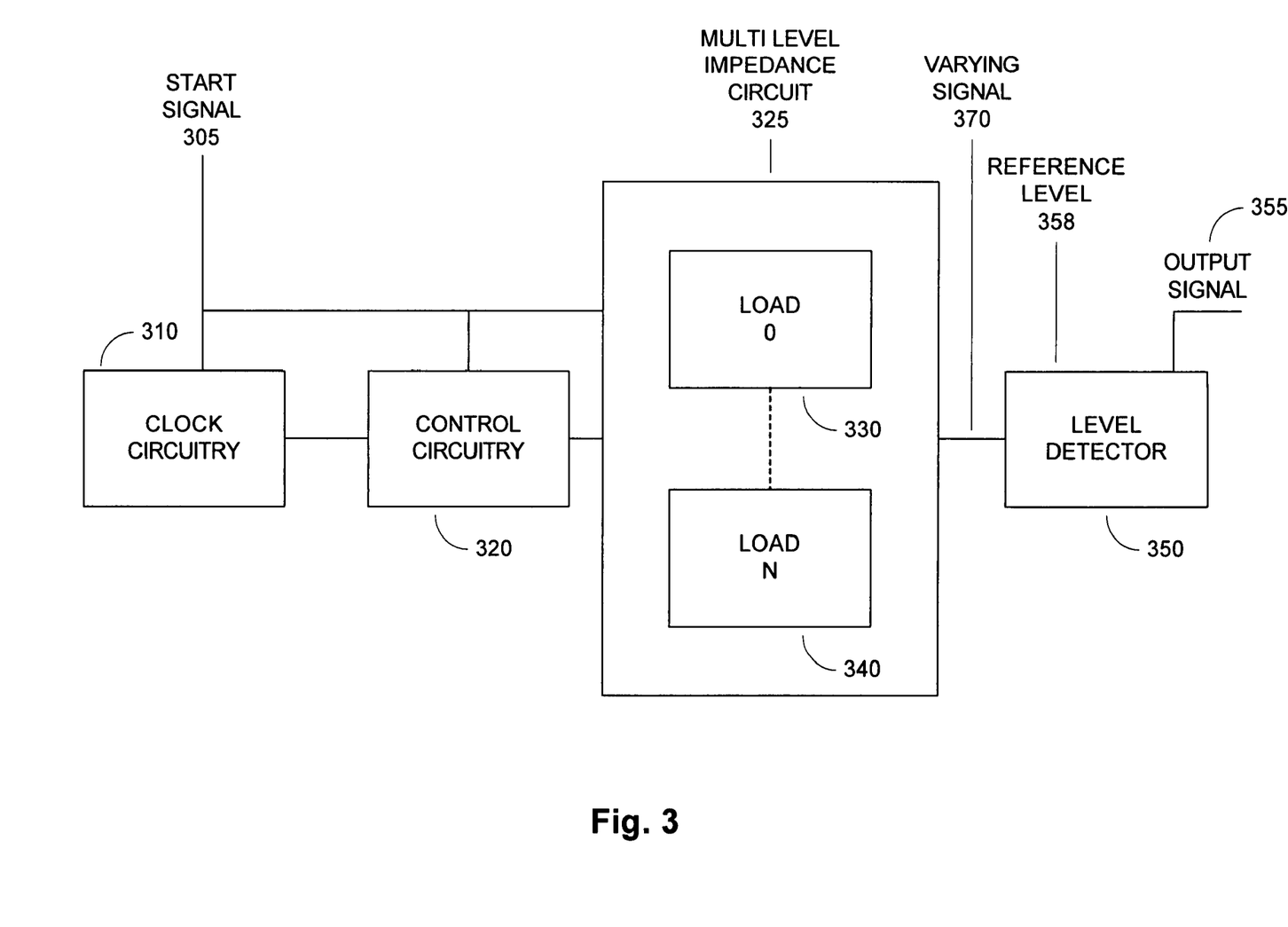
FIG. 3 is a simplified block diagram of a circuit for adjusting the timing of a signal.

FIG. 3 is a simplified block diagram of the temperature compensation circuitry. Clock circuitry 310 generates a clock that determines the rate at which additional impedances of the multiple loads 325 are added to a varying signal 370. Control circuitry 320 receives the clock generated by clock circuitry 310 and creates temperature compensating signals that select the additional impedances of the multiple loads 325 which are added to the varying signal 370. In addition to load 0 330 and load N 340 that are shown, the multiple loads 325 include any additional loads to correspond with the possible outputs of control circuitry 320. For example, in an embodiment with control circuitry 320 selecting 10 possible loads, there are 10 loads in multiple loads 325. More loads in the multiple loads 325 permit more precise control over the delay timing. A start signal 305, typically a timing signal, is coupled to the clock circuitry 310 and control circuitry 320, and multi level impedance circuit 325, and initiates the generation of the output signal 355 with a delay within a pre-specified range over a range of temperatures. The level detector 350 generates the output signal 355 after the varying signal 370 reaches a reference level 358 provided to the level detector 350.

Figure 4:
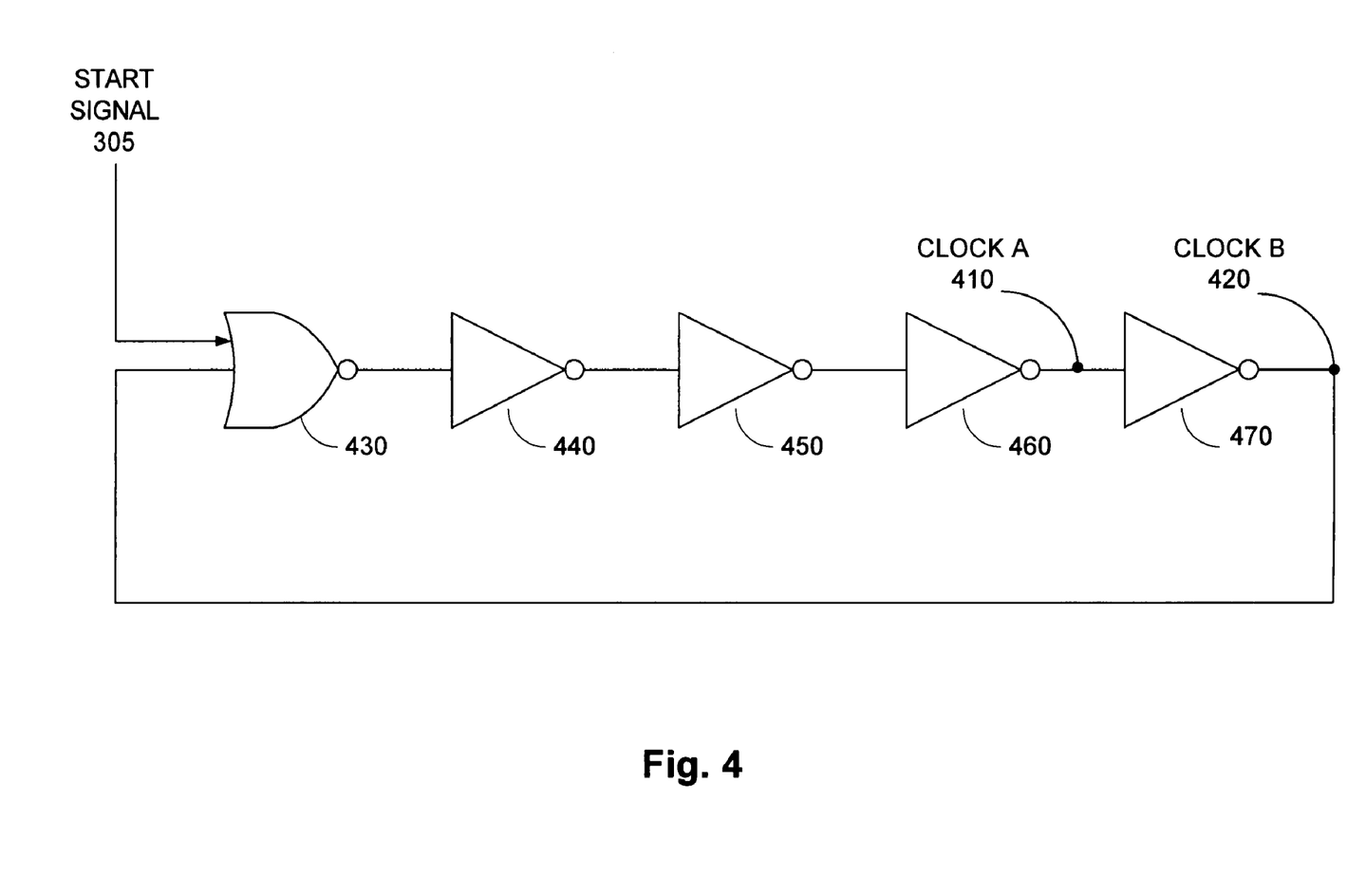
FIG. 4 is a circuit diagram of a simplified clock circuit.

FIG. 4 is a circuit diagram of a simplified clock circuit. The shown ring oscillator is an example of a clock circuit. NOR gate 430, inverter 440, inverter 450, inverter 460, and inverter 470 are coupled in series, such that the output of a prior inverter is coupled to the input of a following inverter. The output of the last inverter 470 is coupled to the input of the NOR gate 430. The number of inverters can be varied to adjust the speed of the clock circuit. Increasing the number of inverters slows down the clock circuit, and decreasing the number of inverters speeds up the clock circuit. In the discussed embodiments, the ring oscillator provides two signals, clockA 410 at the input of inverter 470 and clockb 420 at the output of inverter 470. Because clockA 410 and clockB 420 are respectively from the input and the output of an inverter, clockA 410 and clockB 420 are mostly complementary signals of each other, although clockB 420 has a propagation delay with respect to clockA 410 resulting from processing by inverter 470.

Figure 5:
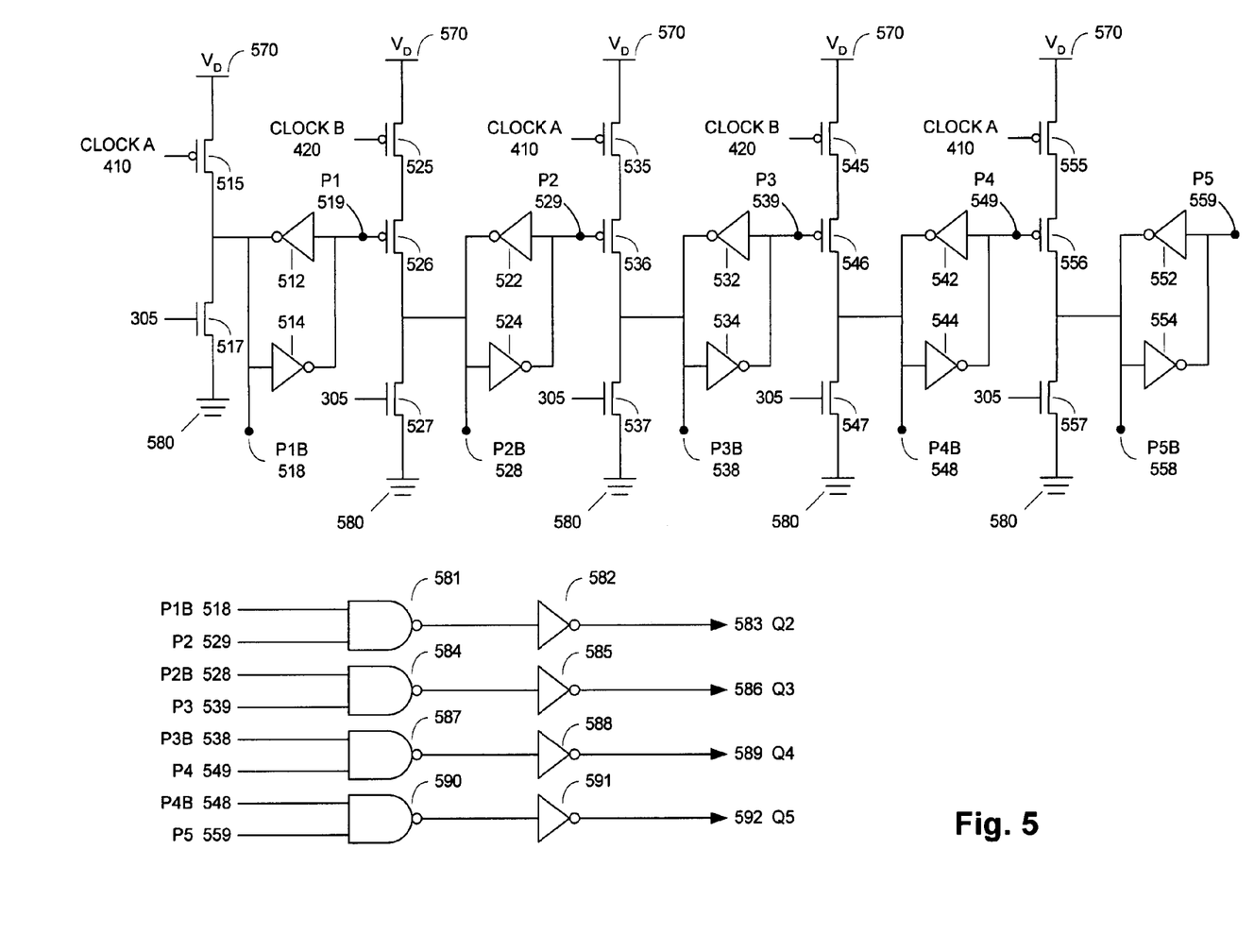
FIG. 5 is a circuit diagram of control circuitry for controlling the addition of impedances according to the clock signal.

FIG. 5 is a circuit diagram of the control circuitry for controlling the addition of impedances according to the clock signal. The control circuitry of this example includes 5 stages. Other embodiments include a different number of stages, for example to control a corresponding number of impedances incrementally added to the varying signal.

The first stage includes p-type transistor 515, n-type transistor 517, and inverters 512 and 514. The p-type transistor 515 has a gate coupled to clockA 410, a first current carrying terminal coupled to supply voltage VD 570, and a second current carrying terminal coupled to node 518. The n-type transistor 517 has a gate coupled to start signal 305, a first current carrying terminal coupled to node 518, and a second current carrying terminal coupled to a ground 580. Inverter 512 and inverter 514 are coupled to form a latch, which is coupled to nodes 518 and 519. Node 518 provides signal P1B and node 519 provides signal P1.

The second stage includes p-type transistors 525 and 526, n-type transistor 527, and inverters 522 and 524. The p-type transistor 525 has a gate coupled to clockb 420, a first current carrying terminal coupled to supply voltage VD 570, and a second current carrying terminal coupled to a current carrying terminal of p-type transistor 526. The p-type transistor 526 has a gate coupled to node 519, a first current carrying terminal coupled to a current carrying terminal of p-type transistor 525, and a second current carrying terminal coupled to node 528. The n-type transistor 527 has a gate coupled to start signal 305, a first current carrying terminal coupled to node 528, and a second current carrying terminal coupled to a ground 580. Inverter 522 and inverter 524 are coupled to form a latch, which is coupled to nodes 528 and 529. Node 528 provides signal P2B and node 529 provides signal P2.

The third stage includes p-type transistors 535 and 536, n-type transistor 537, and inverters 532 and 534. The p-type transistor 535 has a gate coupled to clockA 410, a first current carrying terminal coupled to supply voltage VD 570, and a second current carrying terminal coupled to a current carrying terminal of p-type transistor 536. The p-type transistor 536 has a gate coupled to node 529, a first current carrying terminal coupled to a current carrying terminal of p-type transistor 535, and a second current carrying terminal coupled to node 538. The n-type transistor 537 has a gate coupled to start signal 305, a first current carrying terminal coupled to node 538, and a second current carrying terminal coupled to a ground 580. Inverter 532 and inverter 534 are coupled to form a latch, which is coupled to nodes 538 and 539. Node 538 provides signal P3B and node 539 provides signal P3.

The fourth stage includes p-type transistors 545 and 546, n-type transistor 547, and inverters 542 and 544. The p-type transistor 545 has a gate coupled to clockb 420, a first current carrying terminal coupled to supply voltage VD 570, and a second current carrying terminal coupled to a current carrying terminal of p-type transistor 546. The p-type transistor 546 has a gate coupled to node 539, a first current carrying terminal coupled to a current carrying terminal of p-type transistor 545, and a second current carrying terminal coupled to node 548. The n-type transistor 547 has a gate coupled to start signal 305, a first current carrying terminal coupled to node 548, and a second current carrying terminal coupled to a ground 580. Inverter 542 and inverter 544 are coupled to form a latch, which is coupled to nodes 548 and 549. Node 548 provides signal P4B and node 549 provides signal P4.

The fifth stage includes p-type transistors 555 and 556, n-type transistor 557, and inverters 552 and 554. The p-type transistor 555 has a gate coupled to clockA 410, a first current carrying terminal coupled to supply voltage VD 570, and a second current carrying terminal coupled to a current carrying terminal of p-type transistor 556. The p-type transistor 556 has a gate coupled to node 549, a first current carrying terminal coupled to a current carrying terminal of p-type transistor 555, and a second current carrying terminal coupled to node 558. The n-type transistor 557 has a gate coupled to start signal 305, a first current carrying terminal coupled to node 558, and a second current carrying terminal coupled to a ground 580. Inverter 535 and inverter 554 are coupled to form a latch, which is coupled to nodes 558 and 559. Node 558 provides signal P3B and node 559 provides signal P3.

Also shown is combinational logic. NAND gate 581 has inputs connected to signal P1B 518 and signal P2 529, and an output connected to the input of inverter 582. Inverter 582 has an output generating signal Q2 583. NAND gate 584 has inputs connected to signal P2B 528 and signal P3 539, and an output connected to the input of inverter 585. Inverter 585 has an output generating signal Q3 586. NAND gate 587 has inputs connected to signal P3B 538 and signal P4 549, and an output connected to the input of inverter 588. Inverter 588 has an output generating signal Q4 589. NAND gate 590 has inputs connected to signal P4B 548 and signal P5 559, and an output connected to the input of inverter 591. Inverter 591 has an output generating signal Q5 592.

Figure 6:
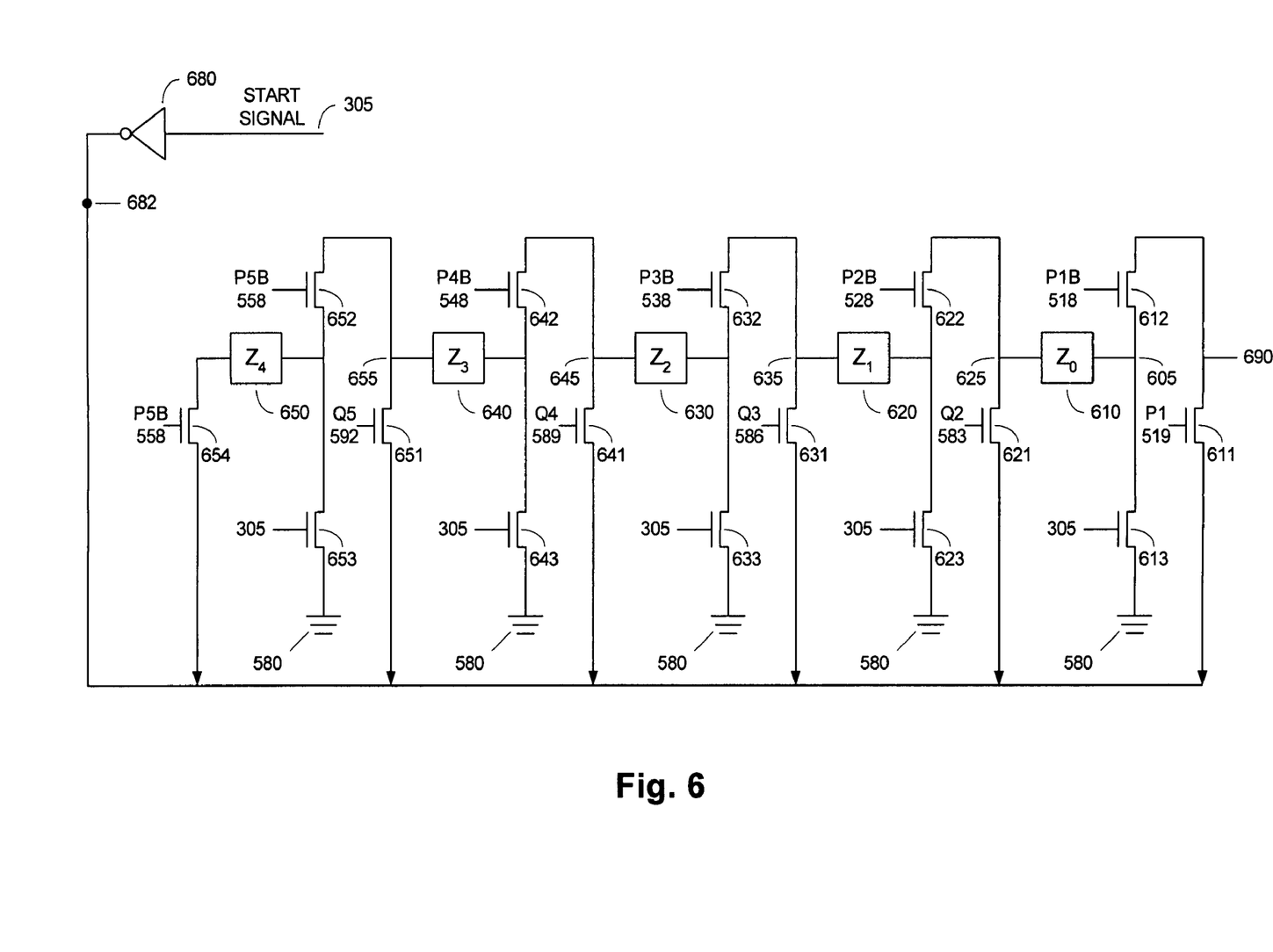
FIG. 6 is a circuit diagram of multiple impedances added to a varying signal according to the control circuitry.

FIG. 6 is a circuit diagram of multiple impedances added to a varying signal according to the control circuitry. The multiple impedances of this example includes 5 stages of impedance. Other embodiments include a different number of impedances, for example to allow for more finely controlled addition of impedances incrementally added to the varying signal.

Inverter 680, in response to a start signal 305, generates at the output node 682 a varying signal going from low to high. In another embodiment, the inverter 680, in response to a start signal, generates at the output a varying signal going from high to low.

The first stage of impedance includes n-type transistors 611, 612, and 613 and load Z0 610. The n-type transistor 611 has a gate coupled to signal P1 519, a first current carrying terminal coupled to an output 690, and a second current carrying terminal coupled to node 605. The n-type transistor 612 has a gate coupled to signal P1B 518, a first current carrying terminal coupled to the output 690, and a second current carrying terminal coupled to node 605. The n-type transistor 613 has a gate coupled to start signal 305, a first current carrying terminal coupled to node 605, and a second current carrying terminal coupled to ground 580. The load Z0 610 is coupled to nodes 605 and 625.

The second stage of impedance includes n-type transistors 621, 622, and 623 and load Z1 620. The n-type transistor 621 has a gate coupled to signal Q2 583, a first current carrying terminal coupled to node 625, and a second current carrying terminal coupled to node 605. The n-type transistor 622 has a gate coupled to signal P2B 528, a first current carrying terminal coupled to node 625, and a second current carrying terminal coupled to node 605. The n-type transistor 623 has a gate coupled to start signal 305, a first current carrying terminal coupled to node 605, and a second current carrying terminal coupled to ground 580. The load Z1 620 is coupled to nodes 605 and 635.

The third stage of impedance includes n-type transistors 631, 632, and 633 and load Z2 630. The n-type transistor 631 has a gate coupled to signal Q3 586, a first current carrying terminal coupled to node 635, and a second current carrying terminal coupled to node 605. The n-type transistor 632 has a gate coupled to signal P3B 538, a first current carrying terminal coupled to node 635, and a second current carrying terminal coupled to node 605. The n-type transistor 633 has a gate coupled to start signal 305, a first current carrying terminal coupled to node 605, and a second current carrying terminal coupled to ground 580. The load Z2 630 is coupled to nodes 605 and 645.

The fourth stage of impedance includes n-type transistors 641, 642, and 643 and load Z3 640. The n-type transistor 641 has a gate coupled to signal Q4 589, a first current carrying terminal coupled to node 645, and a second current carrying terminal coupled to node 605. The n-type transistor 642 has a gate coupled to signal P4B 548, a first current carrying terminal coupled to node 645, and a second current carrying terminal coupled to node 605. The n-type transistor 643 has a gate coupled to start signal 305, a first current carrying terminal coupled to node 605, and a second current carrying terminal coupled to ground 580. The load Z3 640 is coupled to nodes 605 and 655.

The fifth stage of impedance includes n-type transistors 651, 652, 653, and 654 and load Z4 650. The n-type transistor 651 has a gate coupled to signal Q5 592, a first current carrying terminal coupled to node 655, and a second current carrying terminal coupled to node 605. The n-type transistor 652 has a gate coupled to signal P5B 558, a first current carrying terminal coupled to node 655, and a second current carrying terminal coupled to node 605. The n-type transistor 653 has a gate coupled to start signal 305, a first current carrying terminal coupled to node 605, and a second current carrying terminal coupled to ground 580. The n-type transistor 654 has a gate coupled to signal P5B 558, a first current carrying terminal coupled to node 682, and a second current carrying terminal coupled to the load Z4 650. The load Z4 650 is coupled to n-type transistor 654 and node 605.

Figure 7:
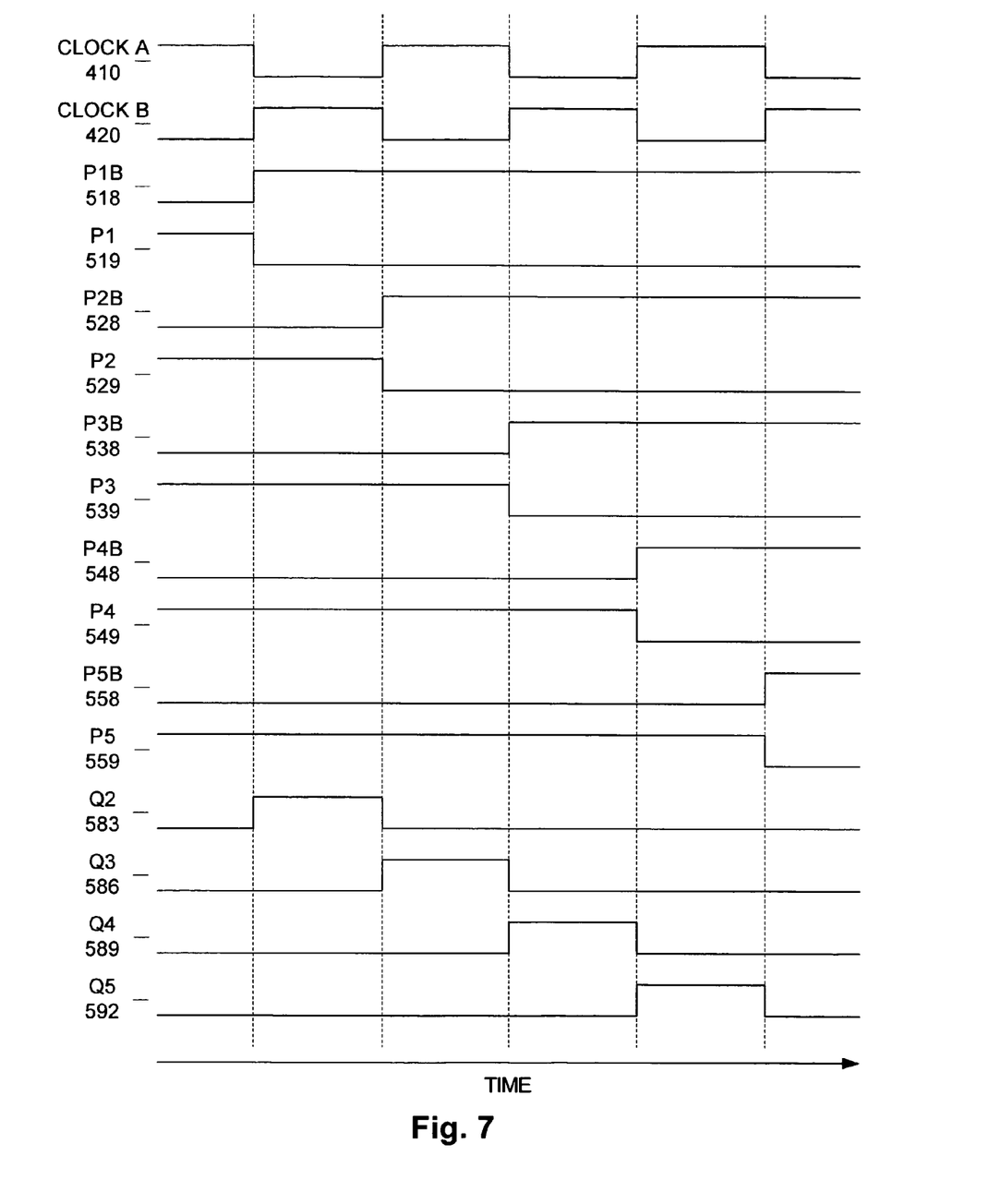
FIG. 7 is a timing diagram showing waveforms from the clock circuit and the control circuitry.

FIG. 7 is a timing diagram showing waveforms from the clock circuit and the control circuitry. ClockA 410 and clockB 420 are respectively from the input and the output of an inverter, in a ring oscillator. Thus, clockA 410 and clockB 420 are mostly complementary signals of each other. The control circuitry becomes active in response to the start signal.

Referring to both FIGS. 5 and 7, the latches formed by inverters 512 and 514, inverters 522 and 524, inverters 532 and 534, inverters 542 and 544, and inverters 552 and 554 initially store low values at, respectively, node 518 P1B, node 528 P2B, node 538 P3B, node 548 P4B, and node 558 P5B. These low values are stored after a start signal 305 turns on n-type transistors 517, 527, 537, 547, and 557. The start signal 305 also stores a high value at node P1 519, node P2 529, node P3 539, node P4 549, and node P5 559. Following the first falling edge on clockA 410, p-type transistor 515 turns on, storing a high value at node 518 P1B and a low value at node 519 P1. The falling edge on clockA 410 also turns on p-type transistors 535 and 555. However, nodes 538 P3B and 558 P5B remain low, because respectively the high value at node 529 P2 keeps intervening p-type transistor 536 turned off and the high value at node 549 P4 keeps intervening p-type transistor 556 turned off.

Following the first falling edge on clockB 420, p-type transistor 525 turns on, storing a high value at node 528 P2B and a low value at node 529 P2. The intervening p-type transistor 526 is turned on by the low value stored at node 519 P1 after the prior falling edge on clockA 410. The falling edge on clockb 420 also turns on p-type transistor 545. However, node 548 P4B remains low, because the high value at node 539 P3 keeps intervening p-type transistor 546 turned off.

Following the second falling edge on clockA 410, p-type transistor 535 turns on, storing a high value at node 538 P3B and a low value at node 539 P3. The intervening p-type transistor 536 is turned on by the low value stored at node 529 P2 after the prior falling edge on clockB 420. The falling edge on clockA 410 also turns on p-type transistor 555. However, node 558 P5B remains low, because the high value at node 549 P4 keeps intervening p-type transistor 556 turned off.

Following the second falling edge on clockB 420, p-type transistor 545 turns on, storing a high value at node 548 P4B and a low value at node 549 P4. The intervening p-type transistor 546 is turned on by the low value stored at node 539 P3 after the prior falling edge on clockA 410.

Following the third falling edge on clockA 410, p-type transistor 555 turns on, storing a high value at node 558 P5B and a low value at node 559 P5. The intervening p-type transistor 556 is turned on by the low value stored at node 549 P4 after the prior falling edge on clockB 420.

Thus, with each falling clock edge, alternating between the falling edges of clockA 410 and clockB 420, an additional latch element of the control circuitry changes its stored value.

The combinational logic creates signals 583 Q2, 586 Q3, 589 Q4, and 592 Q5, each high for half a clock period. NAND gate 581 and inverter 582 create signal 583 Q2, which goes high after signal 518 P1B goes high, and which goes low after signal P2 529 goes low. NAND gate 584 and inverter 585 create signal 586 Q3, which goes high after signal 528 P2B goes high, and which goes low after signal P3 539 goes low. NAND gate 587 and inverter 588 create signal 589 Q4, which goes high after signal 538 P3B goes high, and which goes low after signal P4 549 goes low. NAND gate 590 and inverter 591 create signal 592 Q5, which goes high after signal 548 P4B goes high, and which goes low after signal P5 559 goes low.

Referring to FIG. 6, each additional latch element of the control circuitry changing its stored value causes an additional impedance to be coupled to the varying signal on node 682 generated by inverter 680. Because the control circuitry initially has a high value at node 519 P1 and low values at Q2 583, Q3 586, Q4 589, Q5 592, and P5B 558, the n-type transistor 611 is initially on, and the n-type transistors 621, 631, 641, 651, and 654 are initially off. Thus, none of the loads Z0 610, Z1 620, Z2 630, Z3 640, and Z4 650 is coupled to the varying signal on node 682. As a result, initially the varying signal rises relatively quickly.

The rate at which the varying signal rises slows with each additional load coupled to the varying signal. With each falling clock edge, alternating between the falling edges of clockA 410 and clockB 420, additional load is coupled to the varying signal. Following the first falling edge on clockA 410, a high value is stored at node 518 P1B and a low value stored at node 519 P1. N-type transistor 611 turns off and n-type transistors 612 and 621 turn on. Load Z0 610 is coupled to the varying signal, and is part of the electrical path between node 682 and output 690 through n-type transistors 621 and 612.

Following the first falling edge on clockb 420, a high value is stored at node 528 P2B and a low value stored at node 529 P2. N-type transistor 621 turns off and n-type transistors 622 and 631 turn on. Load Z1 620 also is coupled to the varying signal, and is part of the electrical path between node 682 and output 690 through n-type transistors 631 and 622.

Following the second falling edge on clockA 410, a high value is stored at node 538 P3B and a low value stored at node 539 P3. N-type transistor 631 turns off and n-type transistors 632 and 641 turn on. Load Z2 630 also is coupled to the varying signal, and is part of the electrical path between node 682 and output 690 through n-type transistors 641 and 632.

Following the second falling edge on clockb 420, a high value is stored at node 548 P4B and a low value stored at node 549 P4. N-type transistor 641 turns off and n-type transistors 642 and 651 turn on. Load Z3 640 also is coupled to the varying signal, and is part of the electrical path between node 682 and output 690 through n-type transistors 651 and 642.

Following the third falling edge on clockA 410, a high value is stored at node 558 P5B and a low value stored at node 559 P5. N-type transistor 651 turns off and n-type transistors 652 and 654 turn on. Load Z4 650 also is coupled to the varying signal, and is part of the electrical path between node 682 and output 690 through n-type transistors 654 and 652.

Figure 8A:
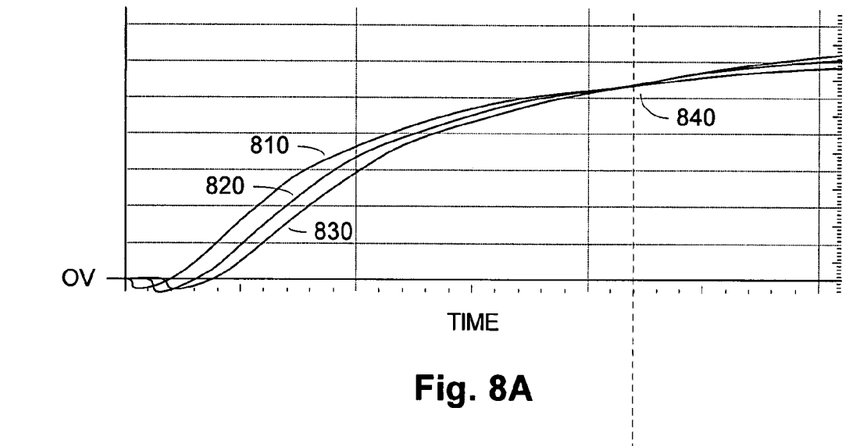
FIGS. 8A and 8B are graphs of voltage traces showing varying signals at different temperatures and signals generated with a delay within a pre-specified range over a range of temperatures.
Figure 8B:
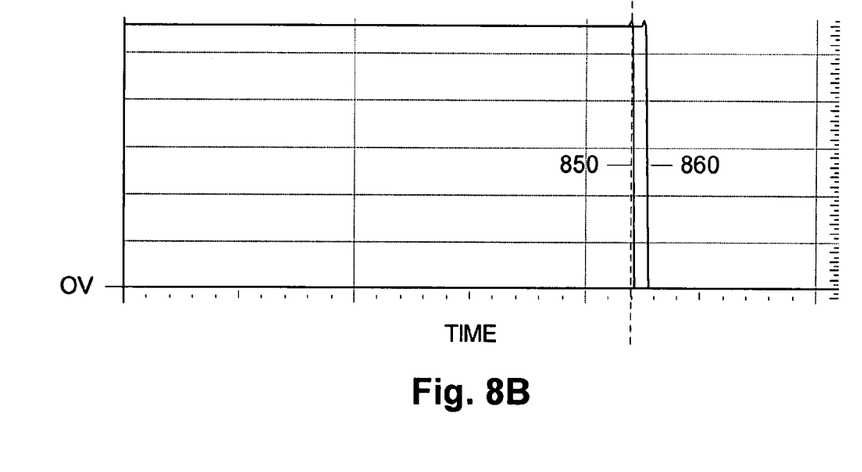

FIGS. 8A and 8B are graphs of voltage traces showing varying signals at different temperatures and signals generated with a delay within a pre-specified range over a range of temperatures. FIG. 8A is a graph showing three traces of varying signals. Trace 810 corresponds to an ambient temperature of 25 degrees Celsius. Trace 820 corresponds to an ambient temperature of 40 degrees Celsius. Trace 830 corresponds to an ambient temperature of 80 degrees Celsius. Traces 810, 820, and 830 intersect approximately at point 835. The delay time is chosen be the time interval beginning with the start signal and ending at the time when the multiple traces corresponding to different ambient temperatures intersect at point 835. FIG. 8B is a graph showing traces 840 and 850 of the output of a level detector. When the varying signal at the corresponding temperature reaches a reference level, then the output signal is generated by the level detector. In the graphs of FIGS. 8A and 8B, the time interval ending at point 835 and where the level detector outputs a transition occur at about 70 ns.

Figure 9:
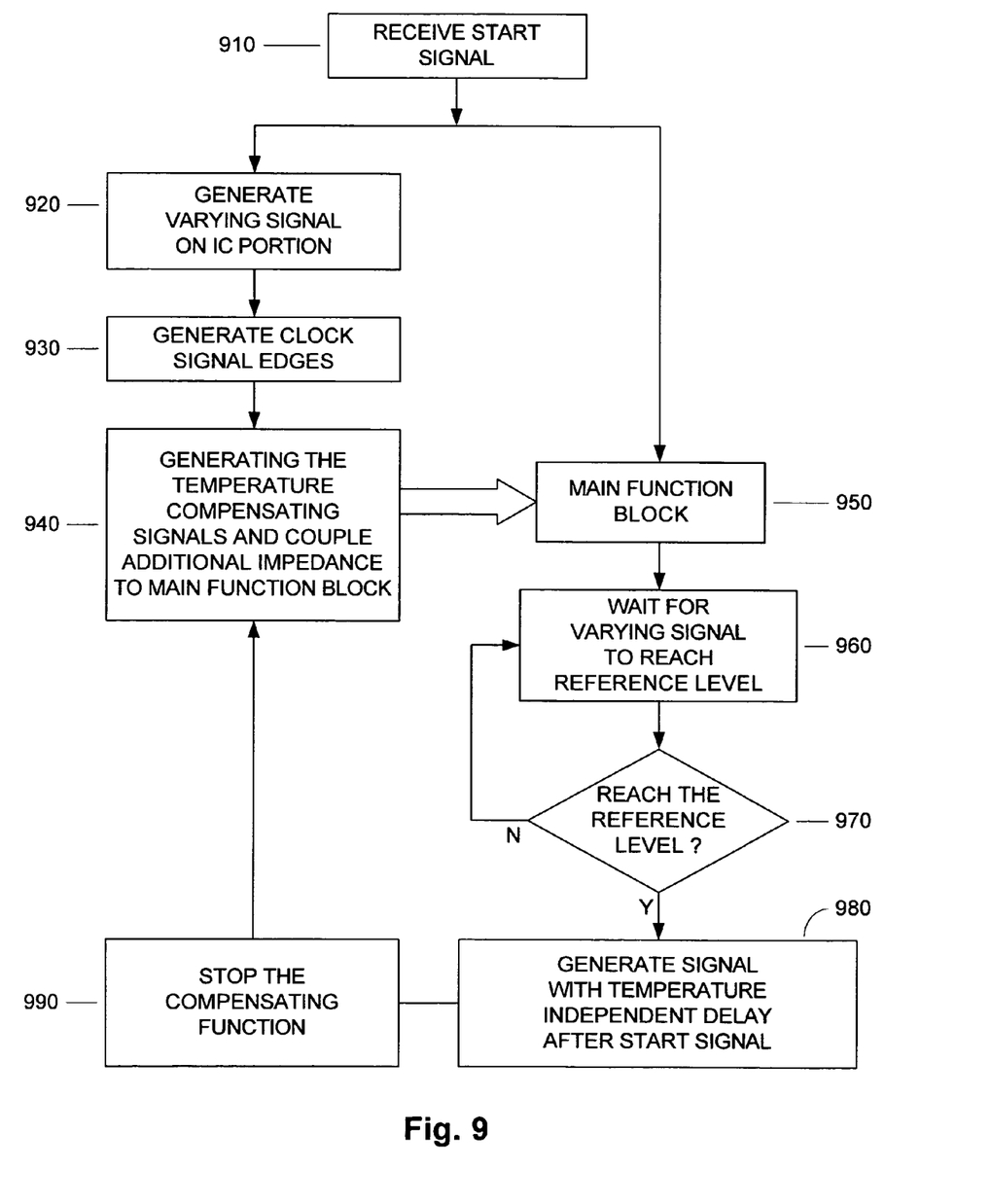
FIG. 9 is an example of a process flow for generating a signal with a delay within a pre-specified range over a range of temperatures.

FIG. 9 is an example of a process flow for generating a signal with a delay within a pre-specified range over a range of temperatures. At 910, a start signal is received. At 920, a varying signal is generated. At 930, clock signal edges are generated. At 940, additional impedance is coupled to the main function block. In parallel with 920, 930, and 940, at 950 the main function block is operating after receiving the start signal. Thus, the timing of the generation of the temperature compensating signals is independent of the timing of the generation of the output signal from the main function block. At 960, a wait occurs until the varying signal reaches the reference level. At 970, a signal is generated with delay within a pre-specified range over a range of temperatures after the start signal. At 980, a signal is generated with temperature independent delay after the start signal—for example, the sense amplifier is generates a signal. At 990, the temperature compensating function is halted.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for generating a temperature compensated signal with an integrated circuit while using the integrated circuit, comprising:

generating a varying signal on a portion of the integrated circuit in response to a start signal at a first time, the varying signal having a varying characteristic;

generating a clock signal on the integrated circuit, wherein the clock signal varies with temperature;

applying the clock signal to a plurality of loads on the integrated circuit;

in response to the clock signal, coupling additional impedance of the plurality of loads to the portion of the circuit with the varying signal; and in response to the varying characteristic of the varying signal reaching a reference level, generating a signal on the integrated circuit at a second time, the signal characterized by a delay within a pre-specified range between the first time and the second time over a temperature range.

2. The method of claim 1 wherein the signal provides timing for a sense amplifier.

3. The method of claim 1 wherein the clock signal is generated more quickly with decreasing temperature.

4. The method of claim 1 wherein the clock signal is generated more slowly with increasing temperature.

5. The method of claim 1 wherein, as temperature decreases, the clock signal is generated more quickly and the additional impedance is coupled to the clock signal more quickly.

6. The method of claim 1 wherein, as temperature increases, the clock signal is generated more slowly and the additional impedance is coupled to the clock signal more slowly.

7. The method of claim 1 wherein the pre-specified range varies no more than 1 nanosecond over the temperature range of at least 120 degrees Celsius.

8. The method of claim 1 wherein the varying characteristic of the varying signal is rising to the reference level.

9. The method of claim 1 wherein the varying characteristic of the varying signal is a voltage rising to the reference level.

10. The method of claim 1 wherein the varying characteristic of the varying signal is lowering to the reference level.

11. The method of claim 1 wherein the varying characteristic of the varying signal is a voltage lowering to the reference level.

12. An integrated circuit device, comprising:

a circuit carrying, in response to a start signal at a first time, a varying signal having a varying characteristic;

clock circuitry configured to generate a clock signal varying with temperature;

a plurality of impedances coupled to the clock circuitry and the circuit, the plurality of impedances having a total impedance that increases in response to the clock signal; and an output coupled to the circuit, the output passing at a second time a signal characterized by a delay within a pre-specified range between the first time and the second time over a temperature range.

13. The device of claim 12 wherein the clock circuitry includes a ring oscillator.

14. The device of claim 12 wherein the clock circuitry generates the clock signal more quickly with decreasing temperature.

15. The device of claim 12 wherein the clock circuitry generates the clock signal more slowly with increasing temperature.

16. The device of claim 12 wherein, as temperature decreases, the clock circuitry generates the clock signal more quickly and the total impedance of the plurality of impedances increases more quickly.

17. The device of claim 12 wherein, as temperature increases, the clock circuitry generates the clock signal more slowly and the total impedance of the plurality of impedances increases more slowly.

18. The device of claim 12 wherein the pre-specified range of the delay has a variation of no more than 1 nanosecond over the temperature range of 120 degrees.

19. The device of claim 12, further comprising:
control circuitry coupled to the clock circuitry and the plurality of impedances, the clock circuitry receiving as input the clock signal and outputting control signals that increase the total impedance of the plurality of impedances in response to each edge of the clock signal.

20. The device of claim 12, further comprising:
control circuitry coupled to the clock circuitry and the plurality of impedances, the clock circuitry receiving as input the clock signal and outputting temperature compensating signals that increase the total impedance of the plurality of impedances in response to each temperature compensating signal,
wherein the control signals turn on NMOS pass transistors that electrically couple additional impedances to the varying signal, and the signal is generated after the varying characteristic of the varying signal rises to a reference level.

21. The device of claim 12, further comprising:
control circuitry coupled to the clock circuitry and the plurality of impedances, the clock circuitry receiving as input the clock signal and outputting control signals that increase the total impedance of the plurality of impedances in response to the clock signal,
wherein the control signals turn on PMOS pass transistors that electrically couple additional impedances to the varying signal, and the signal is generated after the varying characteristic of the varying signal lowers to a reference level.

22. The device of claim 12, further comprising:
a level detector coupled to the plurality of impedances and the output the level detector generating the signal after the varying characteristic of the varying signal rises to a reference level.

23. The device of claim 12, further comprising:
a level detector coupled to the plurality of impedances and the output, the level detector generating the signal after the varying characteristic of the varying signal rises to a reference level,
wherein the varying characteristic is a varying voltage.

24. The device of claim 12, further comprising:
a level detector coupled to the plurality of impedances and the output, the level detector generating the signal after the varying characteristic of the varying signal lowers to a reference level.

25. The device of claim 12, further comprising:
a level detector coupled to the plurality of impedances and the output, the level detector generating the signal after the varying characteristic of the varying signal lowers to a reference level,
wherein the varying characteristic is a varying voltage.

26. The device of claim 12, further comprising:
a memory array; and
a sense amplifier coupled to the memory array,
wherein the signal provides timing for the sense amplifier.

27. A method of manufacturing an integrated circuit device, comprising:
providing a semiconductor substrate;
forming a circuit carrying, in response to a start signal at a first time, a varying signal having a varying characteristic;
forming clock circuitry on the semiconductor substrate configured to generate a clock signal varying with temperature;
forming a plurality of impedances on the semiconductor substrate coupled to the clock circuitry and the circuit, the plurality of impedances having a total impedance that increases in response to the clock signal; and
forming an output on the semiconductor substrate coupled to the circuit, the output passing at a second time a signal characterized by a delay within a pre-specified range between the first time and the second time over a temperature range.

28. The method of claim 27, further comprising:
selecting the plurality of impedances such that the pre-specified range of the delay is substantially constant over the temperature range of at least 120 degrees.

29. The method of claim 27, further comprising:
selecting the plurality of impedances such that the pre-specified range of the delay has a variation of no more than 1 nanosecond over the temperature range of at least 120 degrees.

30. The method of claim 27 wherein the clock circuitry includes a ring oscillator.

31. The method of claim 27 wherein the clock circuitry generates the clock signal more quickly with decreasing temperature.

32. The method of claim 27 wherein the clock circuitry generates the clock signal more slowly with increasing temperature.

33. The method of claim 27 wherein, as temperature decreases, the clock circuitry generates the clock signal more quickly and the total impedance of the plurality of impedances increases more quickly.

34. The method of claim 27 wherein, as temperature increases, the clock circuitry generates the clock signal more slowly and the total impedance of the plurality of impedances increases more slowly.

35. The method of claim 27 wherein the pre-specified range of the delay of the signal has a variation of no more than 1 nanosecond over the temperature range of 120 degrees.

36. The method of claim 27, further comprising:
forming control circuitry coupled to the clock circuitry and the plurality of impedances, the control circuitry receiving as input the clock signal and outputting temperature compensating signals that increase the total impedance of the plurality of impedances in response to each edge of the clock signal.

37. The method of claim 27, further comprising:
forming control circuitry coupled to the clock circuitry and the plurality of impedances, the control circuitry receiving as input the clock signal and outputting control signals that increase the total impedance of the plurality of impedances in response to each edge of the clock signal,
wherein the control signals turn on NMOS pass transistors that electrically couple additional impedances to the varying signal, and the signal is generated after the varying characteristic of the varying signal rises to a reference level.

38. The method of claim 27, further comprising:
forming control circuitry coupled to the clock circuitry and the plurality of impedances, the clock circuitry receiving as input the clock signal and outputting temperature compensating signals that increase the total impedance of the plurality of impedances in response to each temperature compensating signal,
wherein the control signals turn on PMOS pass transistors that electrically couple additional impedances to the varying signal, and the signal is generated after the varying characteristic of the varying signal lowers to a reference level.

39. The method of claim 27, further comprising:
forming a level detector coupled to the plurality of impedances and the output, the level detector generating the signal after the varying characteristic of the varying signal rises to a reference level.

40. The method of claim 27, further comprising:
forming a level detector coupled to the plurality of impedances and the output, the level detector generating the signal after the varying characteristic of the varying signal lowers to a reference level.

41. The method of claim 27, further comprising:
forming a level detector coupled to the plurality of impedances and the output, the level detector generating the signal after the varying characteristic of the varying signal rises to a reference level,
wherein the varying characteristic is a varying voltage.

42. The method of claim 27, further comprising:
forming a level detector coupled to the plurality of impedances and the output, the level detector generating the signal after the varying characteristic of the varying signal lowers to a reference level,
wherein the varying characteristic is a varying voltage.

43. The method of claim 27, further comprising:
forming a memory array; and
forming a sense amplifier coupled to the memory array, wherein the signal provides timing for the sense amplifier.

44. A method of generating a temperature compensated output on an integrated circuit, comprising:
in response to a start signal at a first time on an integrated circuit,
triggering a first circuit of the integrated circuit to perform a main function of the first circuit and generate a main function output signal; and
triggering a second circuit of the integrated circuit to generate a second signal at a second time, the second signal having a delay within a pre-specified range between the first time and the second time, wherein the delay is independent of a timing of the main function output; and
allowing the main function output signal to pass to other circuitry on the integrated circuit after the delay.

45. The method of claim 44, wherein the delay is made independent of the main function output, by controlling the delay with a clock signal triggered in response to the start signal.

46. An integrated circuit device, comprising:
a first circuit performing, in response to a start signal at a first time, a main function of the first circuit and generating a main function output signal;
a second circuit generating, in response to the start signal, a second signal at a second time, the second signal having a delay within a pre-specified range between the first time and the second time, wherein the delay is independent of a timing of the main function output;
a third circuit coupled to the first circuit and the second circuit, the third circuit receiving the main function output signal and the second signal, and allowing the main function output signal to pass to other circuitry on the integrated circuit after the delay.

47. The device of claim 46, further comprising:
a clock circuit generating a clock signal, the clock signal triggered in response to the start signal, wherein the delay is made independent of the main function output, by controlling the delay with the clock signal.

* * * * *